United States Patent
Shikata (10) Patent No.: US 8,063,710 B2
(45) Date of Patent: Nov. 22, 2011

(54) SELF-CALIBRATING OSCILLATOR

(75) Inventor: Eiji Shikata, Sendai (JP)

(73) Assignee: Freescale Semiconductor, Inc., Austin, TX (US)

(*) Notice: Subject to any disclaimer, the term of this patent is extended or adjusted under 35 U.S.C. 154(b) by 62 days.

(21) Appl. No.: 12/703,186

(22) Filed: Feb. 9, 2010

(65) Prior Publication Data

US 2010/0225406 A1 Sep. 9, 2010

(30) Foreign Application Priority Data

Mar. 4, 2009 (JP) ................................. 2009-051205

(51) Int. Cl.
*H03K 3/26* (2006.01)
(52) U.S. Cl. ........................................ 331/111; 331/143
(58) Field of Classification Search ................... 331/111, 331/143
See application file for complete search history.

(56) References Cited

U.S. PATENT DOCUMENTS

5,594,388 A 1/1997 O'Shaughnessy et al.

*Primary Examiner* — Arnold Kinkead
(74) *Attorney, Agent, or Firm* — Charles Bergere (57) ABSTRACT

A self-calibrating oscillator that increases the output frequency accuracy without using a charge pump includes an oscillation circuit, a pulse counter, a charging circuit, a reset circuit, a calibration circuit, and a timing control unit. The pulse counter counts a pulse signal having frequency f0 from the oscillation circuit based on a count start signal provided from the timing control unit, while providing an output signal to the charging circuit. The charging circuit connects a constant current source and capacitor when provided with the output signal to raise the voltage at the connection node. The calibration circuit provides the oscillation circuit with a calibration value for increasing the frequency if the voltage when the output of the output signal ends is higher than a high potential reference voltage and provides a calibration value for lowering the frequency if this voltage is lower than a low potential reference voltage.

6 Claims, 5 Drawing Sheets

SELF-CALIBRATING OSCILLATOR

BACKGROUND OF THE INVENTION

The present invention relates to a self-calibrating oscillator for automatically calibrating output frequency.

Resistance-capacitance (RC) oscillators are widely used in semiconductor products. This is because an RC oscillator is an inexpensive clock source and because various frequencies can be generated by varying the resistance and capacitance. However, a delay that occurs in the circuits of the oscillator may affect the oscillation frequency. The delay time is dependent on the power supply voltage, the environmental temperature, the manufacturing process, and the like. Thus, in practice, an RC oscillator is limited to low-frequency and low-accuracy applications.

Accordingly, an RC oscillator that generates oscillations with high accuracy has been developed (for example, refer to U.S. Pat. No. 5,594,388, page 1). The oscillator described in U.S. Pat. No. 5,594,388 uses a resistor and a capacitor, and has a time constant determined by the resistance and the capacitance. This oscillator differs from the conventional oscillators in that the RC circuit is not used for frequency generation. Instead, the RC time constant is compared to a period obtained from a frequency generated by another oscillation circuit so that self-calibration of the frequency of the entire RC oscillation circuit is performed in accordance with the comparison result.

The oscillator described in U.S. Pat. No. 5,594,388, however, needs a charge pump to generate a voltage signal for calibrating the oscillating frequency. In addition, the oscillator constantly self-calibrates the frequency and thus continuously consumes power.

It is an object of the present invention to provide a self-calibrating oscillator that efficiently increases the accuracy of an output frequency.

BRIEF DESCRIPTION OF THE DRAWINGS

The invention, together with objects and advantages thereof, may best be understood by reference to the following description of the presently preferred embodiments together with the accompanying drawings in which:

FIGS. 2A and 2B are graphs showing temporal changes when the voltage at a connection node is lower than a low potential reference voltage VL, in which FIG. 2A shows the voltage at the connection node, and FIG. 2B shows an output signal of a data line;

FIGS. 3A and 3B are graphs showing temporal changes when the voltage at the connection node is higher than a high potential reference voltage VH, in which FIG. 3A shows the voltage at the connection node, and FIG. 3B shows the output signal of the data line;

DETAILED DESCRIPTION OF THE PREFERRED EMBODIMENTS

One aspect of the present invention is a self-calibrating oscillator including an oscillation circuit, which outputs a frequency corresponding to a calibration value. A pulse counter counts an output signal from the oscillation circuit for a predetermined number of times and outputs a control output signal until the counting is completed. A charging circuit supplies and charges a capacitor with current when being provided with the control output signal. A calibration circuit provides the oscillation circuit with the calibration value corresponding to a comparison of a voltage at a connection node of the capacitor and a reference voltage.

A further aspect of the present invention is a self-calibrating oscillator including an oscillation circuit which outputs a frequency corresponding to a calibration value. A pulse counter counts an output signal from the oscillation circuit for a predetermined number of times, outputs a control output signal from when the counting starts, and outputs a completion indication signal indicating completion of the counting. A charging circuit supplies and charges a capacitor with current when being provided with the control output signal. A calibration circuit receives a reference indication signal, indicating that voltage at a connection node of the capacitor is higher than or equal to a reference voltage, and the completion indication signal, and provides the oscillation circuit with a calibration value that is in accordance with a temporal relationship of when the voltage at the connection node becomes higher than or equal to the reference voltage and when the counting is completed.

Other aspects and advantages of the present invention will become apparent from the following description, taken in conjunction with the accompanying drawings, illustrating by way of example the principles of the invention.

First Embodiment

An oscillator 10 according to a first embodiment of the present invention will now be discussed with reference to FIGS. 1 to 3.

Figure 1:
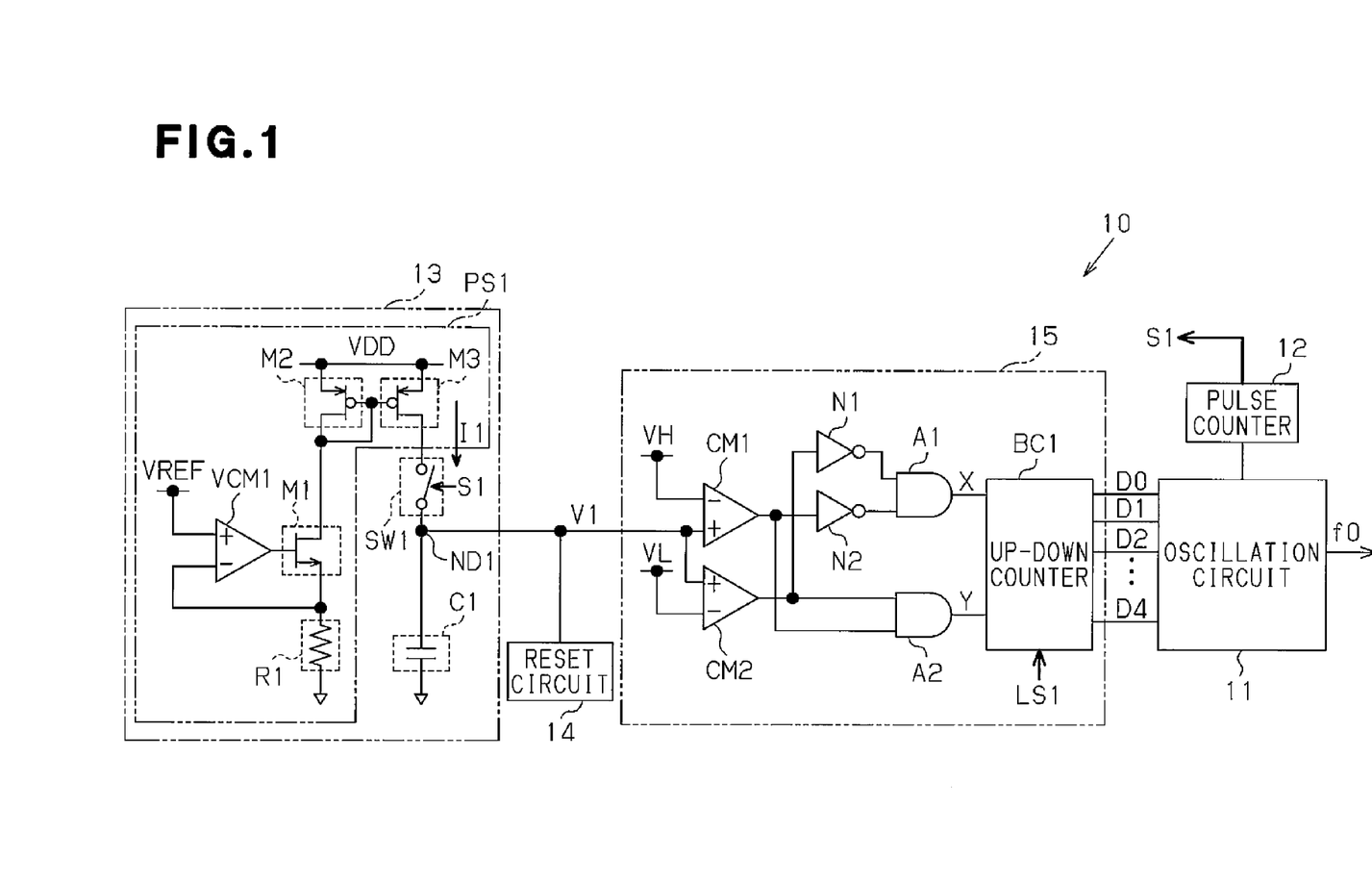
FIG. 1 is a schematic circuit diagram of a self-calibrating oscillator according to a first embodiment of the present invention.

As shown in FIG. 1, the oscillator 10 of the present embodiment includes an oscillation circuit 11, a pulse counter 12, a charging circuit 13, a reset circuit 14, and a calibration circuit 15. Referring to FIGS. 2 and 3, when a frequency f0 of the oscillation circuit 11 is calibrated, a cycle of a charging/holding period T1 and a load/reset period T2 is repeated in the oscillator 10 until a predetermined calibration period ends. The oscillator 10 outputs the frequency f0 obtained when the predetermined calibration period ends as a calibrated frequency.

The oscillator 10 includes a timing control unit (not shown). The timing control unit outputs a signal to start the charging/holding period T1 and the load/reset period T2 when acquiring a calibration start signal from an external device. Specifically, the timing control unit provides a count start signal to the pulse counter 12 when entering a charging/holding period T1. Further, after the count start signal is output and a predetermined charging/holding period T1 ends, the timing control unit provides a load signal LS1 to the calibration circuit 15 when entering a load/reset period T2. When a second predetermined time elapses, which starts from the output of the load signal LS1, the timing control unit provides a reset signal to the reset circuit 14. Then, after a predetermined reset period elapses, which starts from the output of the reset signal, the timing control unit outputs the count start signal and starts the charging/holding period T1 again. The timing control unit stores the calibration period during which the frequency f0 is calibrated and repeatedly performs the output of the count start signal, the load signal LS1, and the reset signal until the calibration period ends.

Oscillation Circuit 11

The oscillation circuit 11 shown in FIG. 1 is formed, for example, by a known voltage control oscillation circuit, and outputs an output signal having the frequency f0. The oscillation circuit 11 is connected to the calibration circuit 15 by a plurality of data lines. The oscillation circuit 11 acquires calibration data through the data lines and calibrates the frequency f0 of the output signal in accordance with a calibration value represented by the calibration data. In the present embodiment, the oscillation circuit 11 acquires the calibration value of "32" from data signals D0, D1, D2, D3, and D4. The oscillation circuit 11 of the present embodiment lowers the frequency f0 of the output signal when the calibration value represented by the data signals D0 to D4 increases, and raises the frequency f0 of the output signal when the calibration value decreases. Furthermore, a pulse signal corresponding to the output signal of the oscillation circuit 11 is provided to the pulse counter 12.

Pulse Counter 12

The pulse counter 12 counts pulse signals, which correspond to the output signal of the oscillation circuit 11. Specifically, the pulse counter 12 starts counting the number of pulse signals when receiving the count start signal from the timing control unit and continues counting for a predetermined number of times until reaching count Nc1. The pulse counter 12 continuously outputs an output signal S1 from when the counting starts to when reaching the count Nc1, that is, during a charging period Tc1. The output signal S1 is provided to the charging circuit 13.

Charging Circuit 13

In the present embodiment, the charging circuit 13 includes a constant current source PS1, a switch SW1, and a capacitor C1, which are connected in series.

When receiving the output signal S1 from the pulse counter 12, the switch SW1 connects the constant current source PS1 and the capacitor C1 to charge the capacitor C1. Therefore, the charging is performed when the output signal S1 is being received, that is, during the charging period Tc1 in which the pulse counter 12 is performing counting. The switch SW1 disconnects the constant current source PS1 and the capacitor C1 when the switch SW1 stops receiving the output signal S1.

The capacitor C1 is arranged between the switch SW1 and a low potential line. A low potential power supply voltage is supplied to the low potential line. The capacitor C1 is charged by closing the switch SW1. Voltage is held by opening the switch SW1 and discharged by the operation of the reset circuit 14. In the present embodiment, the capacitor C1 is supplied with current from the constant current source PS1 and thus charged in proportion to time. When the capacitor C1 is charged, the voltage V1 at a connection node ND1 of the switch SW1 and the capacitor C1 rises in proportion to time.

The constant current source PS1 in the charging circuit 13 generates current I1. The constant current source PS1 includes a comparator VCM1, a resistor R1, and transistors M1, M2, and M3. The transistor M1 is an N-channel MOS transistor, and the transistors M2 and M3 are P-channel MOS transistors.

A reference voltage VREF is applied to a non-inverting input terminal of the comparator VCM1. An inverting input terminal of the comparator VCM1 is connected to a source terminal of the transistor M1. An output terminal of the comparator VCM1 is connected to a gate terminal of the transistor M1.

The source terminal of the transistor M1 is connected to the low potential line via the resistor R1. The drain terminal of the transistor M1 is connected to a high potential line via the transistor M2. A high potential power supply voltage VDD is supplied to the high potential line. Thus, when the current flowing through the transistors M1 and M1 and the resistor R1 starts to change, the comparator VCM1 controls the voltage at the gate terminal of the transistor M1 so as to keep constant the current flowing through the transistors M2 and M1 and the resistor R1.

Further, the transistors M2 and M3 form a current mirror circuit. Specifically, the source terminals of the transistors M2 and M3 are connected to the high potential line. The gate terminals of the transistors M2, M3 are connected to the drain terminal of the transistor M2. The drain terminal of the transistor M3 is connected to the switch SW1. Thus, when the switch SW1 is closed, the constant current source PS1 supplies the current I1, which is proportional to the current flowing through the transistor M2, to the capacitor C1.

Reset Circuit 14

The reset circuit 14 is connected to the connection node ND1 of the switch SW1 and the capacitor C1. The reset circuit 14 discharges the capacitor C1 in response to the reset signal to reset the voltage at the connection node ND1 to the low potential line (initial value). The reset signal thus defines the reset period. Specifically, when acquiring the reset signal from the timing control unit, the reset circuit 14 grounds the connection node ND1, which resets the voltage at the connection node ND1 to the low potential line. When the reset period ends, the reset circuit 14 stops discharging the capacitor C1.

Calibration Circuit 15

The calibration circuit 15 provides the oscillation circuit 11 with the data signals D0 to D4 corresponding to the voltage V1 (charging voltage) when the charging of the capacitor C1 ends. The calibration circuit 15 includes a first comparator CM1, a second comparator CM2, inverters N1, N2, a first AND circuit A1, a second AND circuit A2, and an up-down counter BC1.

The non-inverting input terminals of the first comparator CM1 and the second comparator CM2 are connected to the connection node ND1. A high potential reference voltage VH is supplied to the inverting input terminal of the first comparator CM1. A low potential reference voltage VL is supplied to the inverting input terminal of the second comparator CM2. The high potential reference voltage VH and the low potential reference voltage VL are respectively an upper limit value and a lower limit value of the voltage V1 at the end of the charging period Tc1. The upper and lower limit values are determined by the value of the voltage V1 corresponding to a tolerable range of the frequency f0 output by the oscillation circuit 11. The tolerable range of the frequency f0 will be described later.

The output terminal of the first comparator CM1 is connected to the input terminal of the inverter N2. The output terminal of the inverter N2 is connected to a second input terminal of the first AND circuit A1. The output terminal of the first comparator CM1 is also connected to a second input terminal of the second AND circuit A2.

The output terminal of the second comparator CM2 is connected to the input terminal of the inverter N1. The output terminal of the inverter N1 is connected to a first input terminal of the first AND circuit A1. The output terminal of the second comparator CM2 is also connected to a first input terminal of the second AND circuit A2.

The first AND circuit A1 and the second AND circuit A2 each have two input terminals. The first AND circuit A1 outputs a signal X, and the second AND circuit A2 outputs a signal Y. The signal X output from the first AND circuit A1 has a high level when the two input signals both have a high level. Otherwise, the signal X has a low level. In the same manner, the signal Y output from the second AND circuit A2 has a high level when the two input signals both have a high level. Otherwise, the signal Y has a low level. In the present embodiment, inverted signals of the output signals of the first comparator CM1 and the second comparator CM2 are provided to the first AND circuit A1, and the output signals of the first comparator CM1 and the second comparator CM2 are provided to the second AND circuit A2. Thus, the signal X of the first AND circuit A1 has a high level if the voltage V1 at the end of the charging period Tc1 is lower than the low potential reference voltage VL (and the high potential reference voltage VH). The signal Y of the second AND circuit A2 has a high level if the voltage V1 at the end of the charging period Tc1 is higher than the high potential reference voltage VH (and the low potential reference voltage VL).

The signal X from the first AND circuit A1 and the signal Y from the second AND circuit A2 are provided to the up-down counter BC1. The up-down counter BC1 stores a predetermined initial count value when starting calibration, and updates the count value when the signals X and Y have a high level. Specifically, when the input signal X has a high level, upon receipt of the load signal LS1 during the load/reset period T2, the up-down counter BC1 increases the count value by one and updates the stored count value. When the input signal Y has a high level, upon receipt of the load signal LS1 during the load/reset period T2, the up-down counter BC1 decreases the count value by one and updates the stored count value. The up-down counter BC1 maintains the present stored count value when the signals X and Y have a low level. The data signals D0 to D4 corresponding to the count value are provided to the oscillation circuit 11. In the present embodiment, the count value corresponds to "calibration value corresponding to a comparison of the voltage at a connection node of a capacitor and a reference voltage".

Frequency f0 and its Tolerable Range

The oscillation circuit 11 satisfies the equation shown below.

$$(VH+VL)/2=(1/C1)\times(VREF/R1)\times(Nc1\times f0)$$

When the high potential reference voltage VH, the low potential reference voltage VL, and the reference voltage VREF vary in accordance with the high potential power supply voltage VDD, that is, under the conditions of VH=α× VDD, VL=β×VDD, and VREF=γ×VDD (α, β, γ are constants), the equation shown below is satisfied.

$$f0=(2\times\gamma\times Nc1)/[C1\times R1\times(\alpha+\beta)]$$

However, an error dependent on the high potential reference voltage VH and the low potential reference voltage VL occurs in the frequency f0. This is because the up-down counter BC1 outputs a constant value when the voltage V1 is within a range between the high potential reference voltage VH and the low potential reference voltage VL at the end of the charging period Tc1. The voltage difference of the high potential reference voltage VH and the low potential reference voltage VL functions as a hysteresis, and output fluctuations caused by noise may be suppressed. The lowest frequency f1 and the highest frequency f2 in the tolerable range of the frequency f0 are expressed by the equations shown below.

$$f1=(\gamma\times Nc1)/(C1\times R1\times\alpha)$$

$$f2=(\gamma\times Nc1)/(C1\times R1\times\beta)$$

Thus, the high potential reference voltage VH and the low potential reference voltage VL are approximated to obtain the frequency f0 with high accuracy.

Self-Calibration Process

The self-calibration process of the oscillation circuit 11 of the present embodiment will now be discussed. The timing control unit of the oscillator 10 repeats the charging/holding period T1 and the load/reset period T2 until the calibration period ends.

Charging/Holding Period T1

The timing control unit provides the count start signal to the pulse counter 12 during the charging/holding period T1. When receiving the count start signal, the pulse counter 12 starts counting to the count Nc1. The pulse counter 12 also outputs the output signal S1 while performing the counting. When receiving the output signal S1, the switch SW1 of the charging circuit 13 connects the constant current source PS1 and the capacitor C1 to charge the capacitor C1. Thus, during the charging period Tc1, the capacitor C1 is charged, and the voltage V1 of the connection node ND1 rises in proportion to time.

Then, when reaching the count Nc1 and completing counting, the pulse counter 12 stops providing the charging circuit 13 with the output signal S1. As a result, the switch SW1 of the charging circuit 13 disconnects the constant current source PS1 and the capacitor C1. This stops the charging of the capacitor C1, and the voltage V1 at the connection node ND1 becomes constant due to the charge stored in the capacitor C1. In this case, the first comparator CM1 compares the present voltage V1 (voltage V1 at the end of the charging period Tc1) with the high potential reference voltage VH. Further, the second comparator CM2 compares the voltage V1 at the end of the charging period Tc1 with the low potential reference voltage VL.

V1<VL

When the voltage V1 is lower than the low potential reference voltage VL (and the high potential reference voltage VH), the output signals of the first comparator CM1 and the second comparator CM2 have a low level. As a result, the signal provided to each input terminal of the first AND circuit A1 has a high level. Thus, the signal X of the first AND circuit A1 has a high level. In contrast, the signal provided to each input terminal of the second AND circuit A2 has a low level. Thus, the signal Y of the second AND circuit A2 has a low level.

VL≦V1≦VH

When the voltage V1 is higher than or equal to the low potential reference voltage VL and lower than or equal to the high potential reference voltage VH, the output signal of the first comparator CM1 has a low level, and the output signal of the second comparator CM2 has a high level. As a result, a high level signal and a lower level signal are both provided to the first AND circuit A1 and the second AND circuit A2. Thus, the signals X and Y output from the first and second AND circuits A1 and A2 have a low level.

VH<V1

When the voltage V1 is higher than the high potential reference voltage VH (and the low potential reference voltage VL), the output signals of the first comparator CM1 and the second comparator CM2 have a high level. As a result, the signal provided to each input terminal of the first AND circuit A1 has a low level, and the signal X of the first AND circuit A1 has a low level. Further, the signal provided to each input terminal of the second AND circuit A2 has a high level. Thus, the signal Y of the second AND circuit A2 has a high level.

Load/Reset Period T2

Then, when the charging/holding period T1 ends and the load/reset period T2 starts, the timing control unit provides the load signal LS1 to the up-down counter BC1. Upon receipt of the load signal LS1, the up-down counter BC1 updates its count value by adding one to the stored count value when the signal X of the first AND circuit A1 has a high level and subtracting one from the stored count value when the signal Y of the second AND circuit A2 has a high level. The up-down counter BC1 also stores the count value that is updated in this manner. The up-down counter BC1 then provides the oscillation circuit 11 with the data signals D0 to D4, which correspond to the count value.

Then, the timing control unit provides the reset signal to the reset circuit 14. The reset circuit 14, when receiving the reset signal, sets the potential at the connection node ND1 to the potential at the low potential line. The load/reset period T2 ends when the reset period ends.

In the present embodiment, the count value of the up-down counter BC1 is varied by one and the frequency f0 is calibrated whenever a single cycle of the charging/holding period T1 and load/reset period T2 ends. The operation when repeating such a cycle will now be discussed.

Calibration Performed by Raising Voltage V1

Figure 2A:
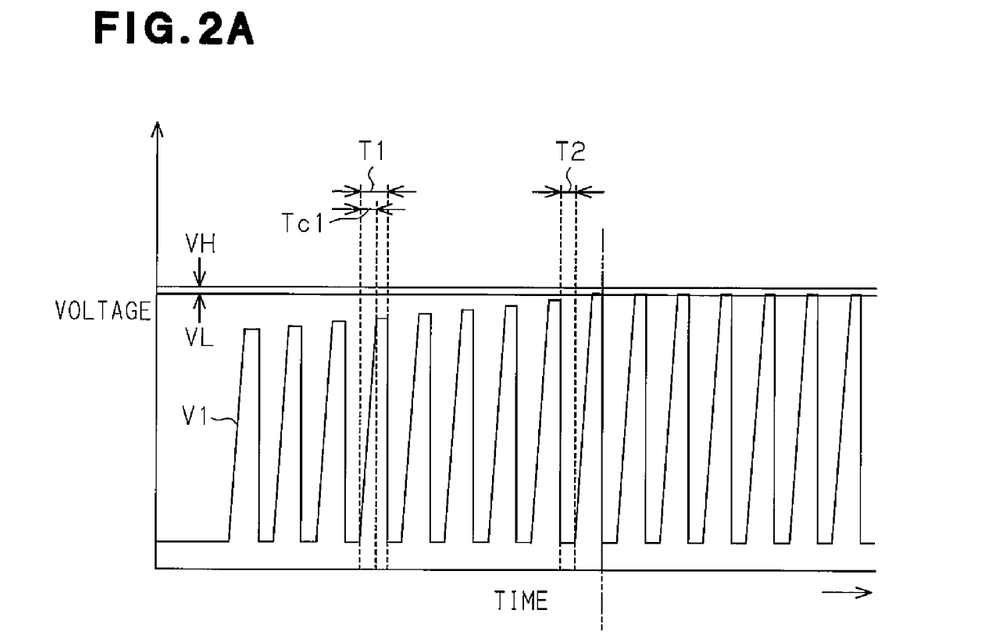
Figure 2B:
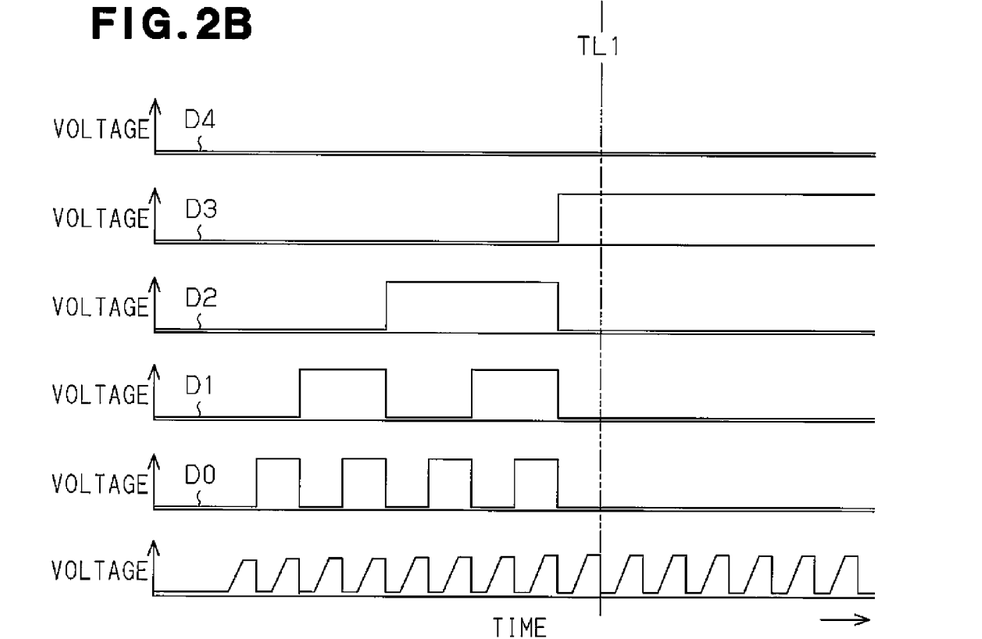

FIG. 2A shows changes in the voltage V1 in a case in which the voltage V1 at the end of the charging period Tc1 is gradually raised to calibrate the frequency f0. FIG. 2B shows the corresponding changes in the data signals D0 to D4. The up-down counter BC1 stores "0" as the initial count value.

In this case, the voltage V1 at the end of the charging period Tc1 is lower than the low potential reference voltage VL. Thus, the up-down counter BC1 of the calibration circuit 15 provides the oscillation circuit 11 with the data signals D0 to D4 corresponding to a count value that is increased by one from the count value of the previous cycle. The oscillation circuit 11 outputs a calibrated signal to lower the frequency f0 in accordance with the data signals D0 to D4. The pulse counter 12 counts the pulse signal of the frequency f0 until reaching the count Nc1. Thus, the output signal S1 is output for a longer time than the previous cycle. This charges the capacitor C1 during the charging period Tc1 for a longer time than the previous cycle, and the voltage V1 at the end of the charging period Tc1 becomes higher than the previous cycle.

The voltage V1 at the end of the charging period Tc1 gradually becomes higher whenever a single cycle is performed by repeating the above operations. As a result, the voltage V1 at the end of the charging period Tc1 becomes a value between the low potential reference voltage VL and the high potential reference voltage VH before the calibration period ends. As shown in FIG. 2, after the voltage V1 at the end of the charging period Tc1 becomes a value between the low potential reference voltage VL and the high potential reference voltage VH (after time TL1 in FIG. 2), the up-down counter BC1 outputs constant data signals D0 to D4. Subsequently, when the calibration period ends, the calibrated frequency f0 is output by constantly providing the present data signals D0 to D4 to the oscillation circuit 11.

Calibration Performed by Lowering Voltage V1

Figure 3A:
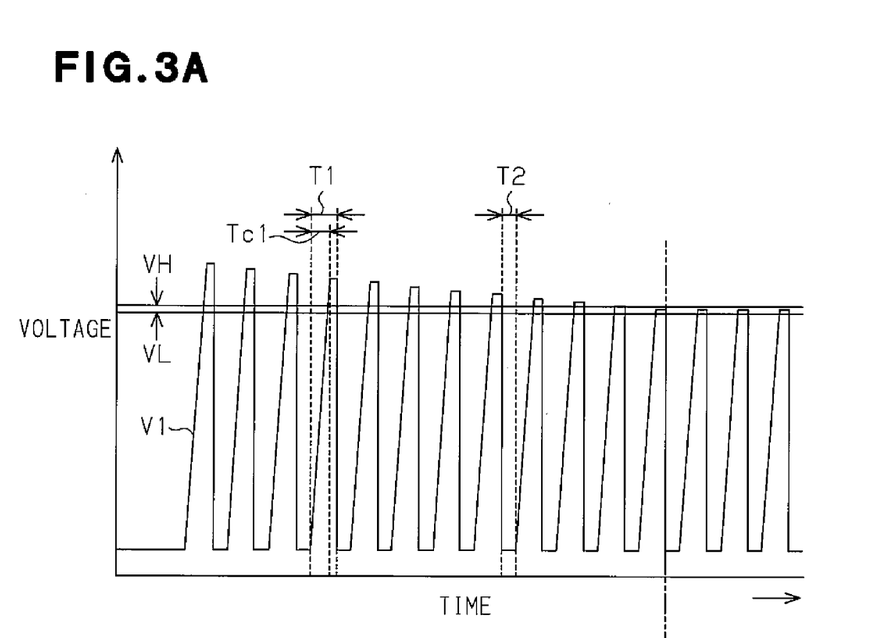
Figure 3B:
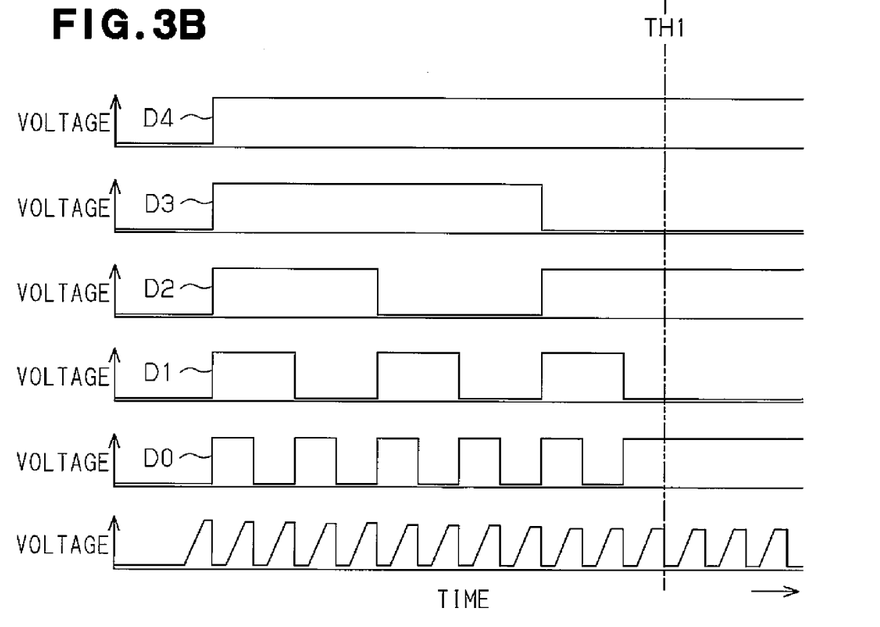

FIG. 3A shows changes in the voltage V1 in a case in which the voltage V1 at the end of the charging period Tc1 is gradually lowered to calibrate the frequency f0. FIG. 3B shows the corresponding changes in the data signals D0 to D4. The up-down counter BC1 stores "0" as the initial count value.

In this case, the voltage V1 at the end of the charging period Tc1 is higher than the high potential reference voltage VH. Thus, the up-down counter BC1 of the calibration circuit 15 provides the oscillation circuit 11 with the data signals D0 to D4 corresponding to a count value that is decreased by one from the count value of the previous cycle. The oscillation circuit 11 outputs a calibrated signal to raise the frequency f0 in accordance with the data signals D0 to D4. The pulse counter 12 counts the pulse signal of the frequency f0 until reaching the count Nc1. Thus, the output signal S1 is output for a shorter time than the previous cycle. This charges the capacitor C1 during the charging period Tc1 for a shorter time than the previous cycle, and the voltage V1 at the end of the charging period Tc1 becomes lower than the previous cycle.

The voltage V1 at the end of the charging period Tc1 gradually becomes lower whenever a single cycle is performed by repeating the above operations. As a result, the voltage V1 at the end of the charging period Tc1 becomes a value between the low potential reference voltage VL and the high potential reference voltage VH before the calibration period ends. As shown in FIG. 3, after the voltage V1 at the end of the charging period Tc1 becomes a value between the low potential reference voltage VL and the high potential reference voltage VH (after time TH1 in FIG. 3), the up-down counter BC1 outputs constant data signals D0 to D4. Subsequently, when the calibration period ends, the calibrated frequency f0 is output by constantly providing the present data signals D0 to D4 to the oscillation circuit 11.

The present embodiment has the advantages described below.

(1) In the present embodiment, upon receipt of the count start signal, the pulse counter 12 counts the pulse signal corresponding to the frequency f0 of the output signal of the oscillation circuit 11 until reaching the count Nc1. The pulse counter 12 also outputs the output signal S2 during this period. When acquiring the output signal S1, the switch SW1 of the charging circuit 13 connects the constant current source PS1 and the capacitor C1 to charge the capacitor C1. This raises the voltage V1 at the connection node ND1. When the voltage V1 is higher than the high potential reference voltage VH, the calibration circuit 15 provides the oscillation circuit 11 with a calibration value that increases the frequency f0. When the voltage V1 is lower than the low potential reference voltage VL, the calibration circuit 15 provides the oscillation circuit 11 with a calibration value that decreases the frequency f0. Thus, the capacitor C1 is charged during the charging period Tc1 corresponding to the calibrated frequency f0, and the voltage V1 at the end of the charging period Tc1 is varied accordingly. Since the frequency f0 of the oscillation circuit 11 is calibrated in accordance with the voltage V1, the oscillator 10 efficiently and automatically calibrates the frequency f0 without using a charge pump.

(2) In the present embodiment, the frequency f0 is calibrated until the voltage V1 is included in a range between the low potential reference voltage VL and the high potential reference voltage VH. Thus, the accuracy of the frequency f0 may be increased by approximating the low potential reference voltage VL and the high potential reference voltage VH.

(3) In the present embodiment, the calibration circuit 15 includes the first comparator CM1, which compares the voltage V1 with the high potential reference voltage VH, the second comparator CM2, which compares the voltage V1 with the low potential reference voltage VL, the inverters N1 and N2, the first AND circuit A1, the second AND circuit A2, and the up-down counter BC1. The signal X is generated with a high level from the output results of the first comparator CM1 and the second comparator CM2 when the voltage V1 is lower than the low potential reference voltage VL. The signal Y is generated with a high level from the output results of the first comparator CM1 and the second comparator CM2 when the voltage V1 is higher than the high potential reference voltage VH. The signals X and Y are each generated with a low level from the output results of the first comparator CM1 and the second comparator CM2 when the voltage V1 is included in a range between the low potential reference voltage VL and the high potential reference voltage VH. Upon receipt of the load signal LS1 from the timing control unit, the up-down counter BC1 adds one to its count value when the signal X has a high level and subtracts one from its count value when the signal Y has a high level. The up-down counter BC1 then stores the updated count value and provides the oscillation circuit 11 with the data signals D0 to D4, which indicate the calibration value corresponding to the updated count value. The up-down counter BC1 maintains the stored count value when the signals X and Y have a low level. The oscillation circuit 11 calibrates the frequency f0 of the output signal in accordance with the calibration value represented by the data signals D0 to D4. Accordingly, the oscillator 10 automatically calibrates the frequency f0 with a simple structure.

(4) In the present embodiment, the timing control unit stores the calibration period to end the calibration of the frequency f0. Further, the timing control unit measures the charging/holding period T1 and the load/reset period T2 and generates the count start signal, the load signal LS1, and the reset signal until the calibration period ends. Therefore, when the calibration period ends and thereby finishes calibration, the timing control unit stops generating the signals for calibrating the frequency f0. This lowers power consumption.

(5) In the present embodiment, the charging circuit 13 includes the constant current source PS1, the switch SW1, and the capacitor C1, which are connected in series. When receiving the output signal S1 from the pulse counter 12, the switch SW1 connects the constant current source PS1 and the capacitor C1 to charge the capacitor C1. Thus, the capacitor C1 is charged in proportion to time, and the voltage at the connection node ND1 is charged in proportion to time. Accordingly, calibration of the frequency f0 is facilitated.

(6) In the present embodiment, the reset circuit 14 is connected to the connection node ND1. The reset circuit 14 resets the voltage at the connection node ND1 to the potential of the low potential line when receiving the reset signal from the timing control unit during the load/reset period T2. Thus, the voltage V1 at the connection node ND1 is forcibly set to the potential at the low potential line before the pulse counter 12 starts counting. Thus, the increase amount of the voltage V1 during the charging period Tc1, which corresponds to the frequency f0, detected with further accuracy. Accordingly, the frequency f0 is calibrated with further accuracy by calibrating the frequency f0 based on the voltage V1.

Second Embodiment

Figure 4:
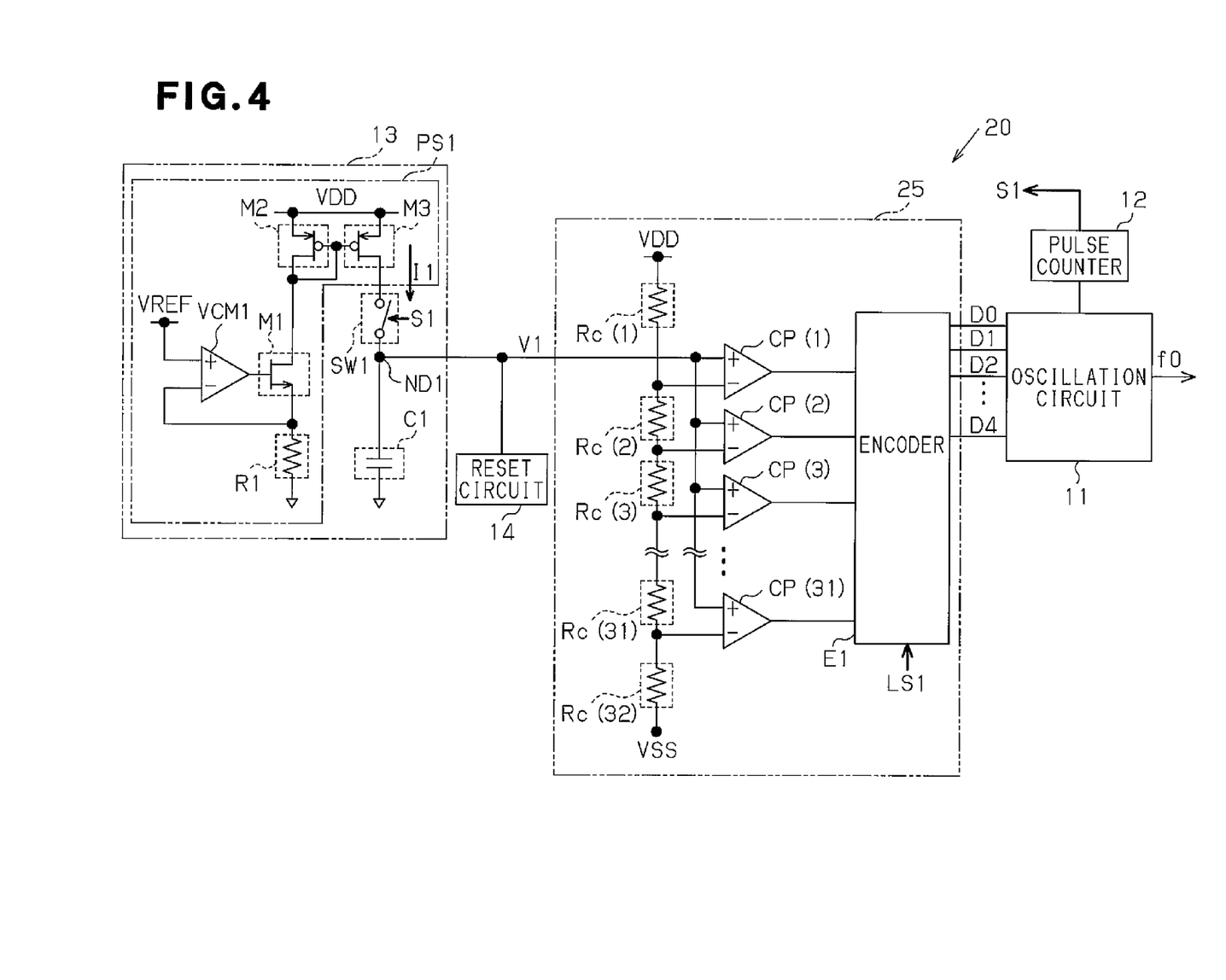
FIG. 4 is a schematic circuit diagram of a self-calibrating oscillator according to a second embodiment of the present invention.

A second embodiment of the present invention will now be discussed with reference to FIG. 4. In the following embodiments, like or same reference numerals are given to those components that are the same as the corresponding components of the first embodiment. Such components will not be described in detail.

In the present embodiment, a calibration circuit 25 is used in lieu of the calibration circuit 15 of the first embodiment. Thus, in the same manner as the first embodiment, an oscillator 20 of the present embodiment includes the oscillation circuit 11, the pulse counter 12, the charging circuit 13, the reset circuit 14, the calibration circuit 25, and the timing control unit.

The calibration circuit 25 determines the data signals D0 to D4 based on the voltage V1 at the end of the charging period Tc1, and provides the oscillation circuit 11 with the data signals D0 to D4. The calibration circuit 25 of the present embodiment is a so-called flash analog-to-digital (AD) converter. Specifically, the calibration circuit 25 includes thirty-one comparators CP(1), CP(2), CP(3), . . . , and CP(31) and an encoder E1, which is connected to the output terminal of each of the comparators CP(1) to CP(31).

Each of the comparators CP(1) to CP(31) has a non-inverting input terminal, which is connected to the connection node ND1, and an inverting input terminal. Voltages (divisional voltages) generated by dividing the potential between the high potential power supply voltage VDD and the low potential power supply voltage VSS with resistors Rc(1), Rc(2), Rc(3), . . . , Rc(31), and Rc(32), are applied to the inverting input terminals of the corresponding comparators CP(1) to CP(31). Thus, in the present embodiment, the high potential power supply voltage VDD corresponds to a high potential reference voltage, and the low potential power supply voltage VSS corresponds to a low potential reference voltage.

Specifically, thirty-two resistors Rc(1) to Rc(32) are connected in series between the high potential line and the low potential line. The high potential power supply voltage VDD is supplied to the high potential line, and the low potential power supply voltage VSS is supplied to the low potential line. In the present embodiment, the resistors Rc(1) to Rc(32) have the same resistance. A connection node between the resistor Rc(1) and the resistor Rc(2) is connected to the inverting input terminal of the comparator CP(1), and a connection node between the resistor Rc(2) and the resistor Rc(3) is connected to the inverting input terminal of the comparator CP(2). In other words, the connection node between the resistor Rc(n) and the resistor Rc(n+1) is connected to the inverting input terminal of the comparator CP(n), where n is an integer. Further, the inverting input terminal of the comparator CP(31) is connected to the low potential power supply voltage VSS via the resistor Rc(32).

The output terminal of each of the comparators CP(1) to CP(31) is connected to the encoder E1. The encoder E1 converts a thermometer code, which is obtained from the output signal of each comparator CP(1) to CP(31), into a binary code. Further, the encoder E1 receives the load signal LS1. When receiving the load signal LS1, the encoder E1 provides the oscillation circuit 11 with the data signals D0 to D4, which represent the converted binary code.

Self-Calibration Process

The self-calibration process of the present embodiment will now be discussed. In the same manner as the first embodiment, in the present embodiment, the timing control unit repeatedly measures the charging/holding period T1 and the load/reset period T2 until the calibration period ends. Further, the timing control unit generates the count start signal, the load signal LS1, and the reset signal.

In the present embodiment, when the charging/holding period T1 starts, in the same manner as the first embodiment, the pulse counter 12 provides the charging circuit 13 with the output signal S1 in accordance with the frequency f0 of the output signal from the oscillation circuit 11. In the charging circuit 13, the capacitor C1 is charged to raise the voltage V1 at the connection node ND1. When the pulse counter 12 stops providing the output signal S1 to the charging circuit 13, the switch SW1 disconnects the constant current source PS1 and the capacitor C1, the capacitor C1 holds the stored charge, and the voltage V1 at the connection node ND1 becomes constant.

Each of the comparators CP(1) to CP(31) compares the voltage V1 at the end of the charging period Tc1 with the voltage supplied to its inverting input terminal. When the voltage V1 supplied to a comparator is higher than the voltage supplied to its inverting input terminal, the comparator provides the encoder E1 with an output signal having a high level. When the voltage V1 supplied to a comparator is lower than the voltage supplied to its inverting input terminal, the comparator provides the encoder E1 with an output signal having a low level.

In the load/reset period T2, the timing control unit provides the load signal LS1 to the encoder E1. When receiving the load signal LS1, the encoder E1 specifies the binary code corresponding to the output signal level of each of the comparators CP(1) to CP(31) and provides the oscillation circuit 11 with the data signals D0 to D4, which represent the binary code.

In addition to advantages (1) and (4) to (6), which are described above, the present embodiment has the advantage described below.

(7) In the present embodiment, the calibration circuit 25 is a flash AD converter including the comparators CP(1) to CP(31) and the encoder E1, which is connected to the output terminal of each of the comparators CP(1) to CP(31). The voltage V1 at the connection node ND1 rises in accordance with the frequency f0 of the output signal from the oscillation circuit 11. Further, the voltage V1 is supplied to the non-inverting input terminal of each of the comparators CP(1) to CP(31). The comparators CP(1) to CP(31) each compare the voltage V1 at the end of the charging period Tc1 with the voltage obtained by dividing the potential between the high potential power supply voltage VDD and the low potential power supply voltage VSS with the corresponding resistors Rc(1) to Rc(32). Then, the comparators CP(1) to CP(31) each provide the encoder E1 with an output signal of the comparison result. The encoder E1 converts a thermometer code, which is obtained from the output signal of each comparator CP(1) to CP(31), into a binary code. Then, when receiving the load signal LS1, the encoder E1 provides the oscillation circuit 11 with the data signals D0 to D4 representing the binary code. Thus, the voltages obtained by dividing the high potential power supply voltage VDD and the low potential power supply voltage VSS with the resistors Rc(1) to Rc(32) are simultaneously compared with the voltage V1 at the end of the charging period Tc1. Further, the encoder E1 calculates the calibration value based on the comparison result. Thus, the oscillation circuit 11 calibrates the frequency f0 within a shorter period of time.

Third Embodiment

Figure 5:
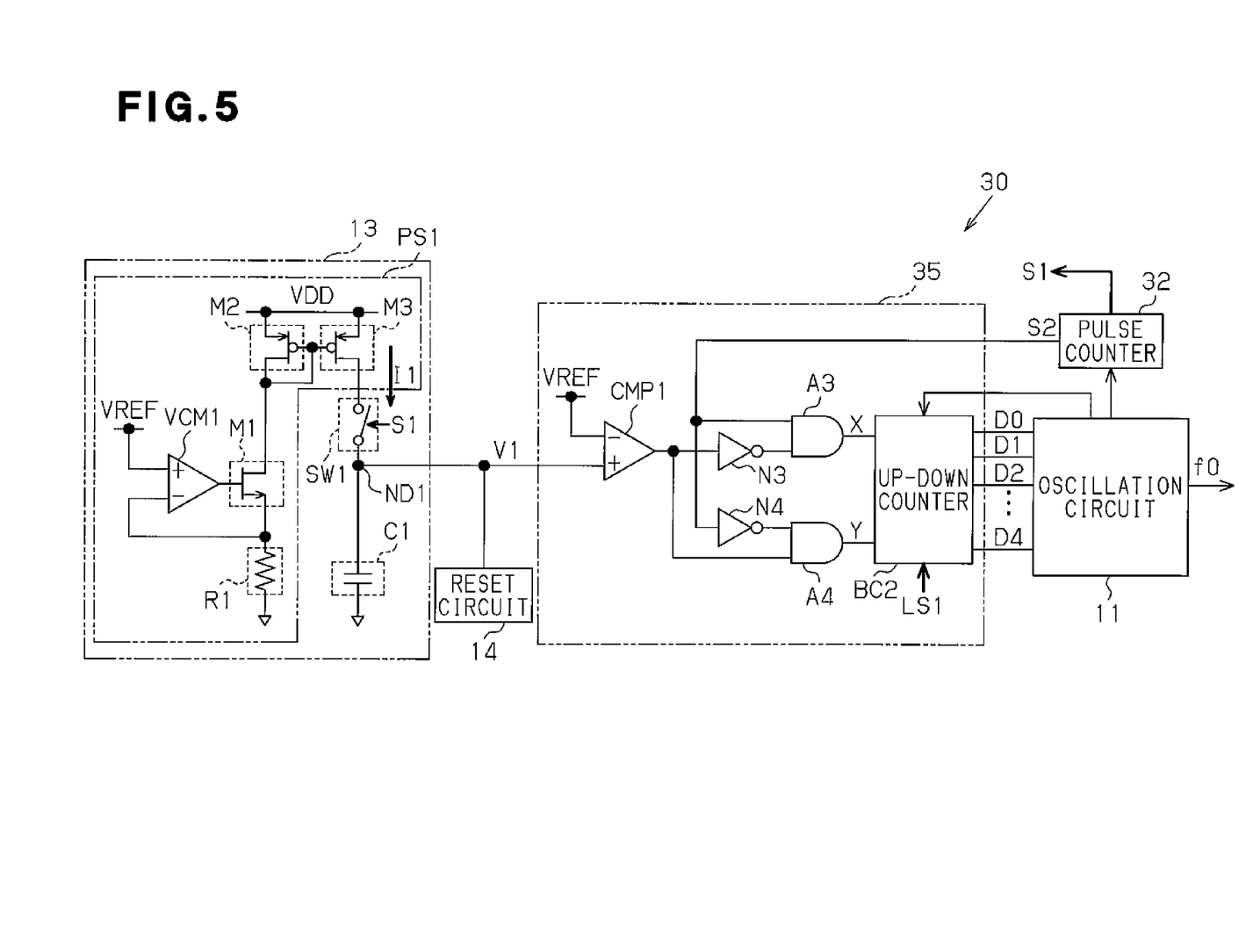
FIG. 5 is a schematic circuit diagram of a self-calibrating oscillator according to a third embodiment of the present invention.

A third embodiment of the present invention will now be discussed with reference to FIG. 5. In the present embodiment, a pulse counter 32 and a calibration circuit 35 are used in lieu of the pulse counter 12 and the calibration circuit 15 of the first embodiment. Thus, in the same manner as the first embodiment, an oscillator 30 of the present embodiment includes the oscillation circuit 11, the pulse counter 32, the charging circuit 13, the reset circuit 14, the calibration circuit 35, and the timing control unit.

The pulse counter 32 of the present embodiment is connected to the charging circuit 13 and provides the output signal S1 to the charging circuit 13. The pulse counter 32 receives the count start signal and outputs the output signal S1 (sets the output signal S1 to a high level) when starting the counting of the pulse signal. The pulse counter 32 receives the reset signal from the timing control unit. The pulse counter 32 differs from the first embodiment in that its stops outputting the output signal S1 (sets the output signal S1 to a low level) when receiving the reset signal. Therefore, the pulse counter 32 maintains the high level until receiving the reset signal (during the period the output signal of the comparator CMP1 has a low level). Thus, in the present embodiment, the charging circuit 13 charges the capacitor C1 upon receipt of the output signal S1 from the pulse counter 32 during the charging/holding period T1. Accordingly, the voltage V1 at the connection node ND1 is always higher than or equal to the reference voltage VREF.

Further, the pulse counter 32 counts the pulse signal until reaching the count Nc1. When the count Nc1 is reached and counting is completed, the pulse counter 32 provides the calibration circuit 35 with a calibration reference signal S2, which serves as a completion indication signal. The calibration reference signal S2 has a low level when counting is being performed and a high level when counting is completed.

The calibration circuit 35 of the present embodiment determines the data signals D0 to D4 based on the voltage V1 of the connection node ND1 and provides the data signals D0 to D4 to the oscillation circuit 11. The calibration circuit 35 includes a comparator CMP1, inverters N3 and N4, a first AND circuit A3, a second AND circuit A4, and an up-down counter BC2.

The comparator CMP1 has a non-inverting input terminal connected to the connection node ND1. The reference voltage VREF is applied to an inverting input terminal of the comparator CMP1. The output terminal of the comparator CMP1 is connected to the input terminal of the inverter N3. The output terminal of the inverter N3 is connected to a second input terminal of the first AND circuit A3. Further, the output terminal of the comparator CMP1 is connected to a second input terminal of the second AND circuit A4.

The first AND circuit A3 and the second AND circuit A4 each have two input terminals like the first and second AND circuits A1 and A2 of the first embodiment. In the present embodiment, a first input terminal of the first AND circuit A3 is connected to the pulse counter 32 and receives the calibration reference signal S2. Further, the inverted signal of the calibration reference signal S2 is provided to a first input terminal of the second AND circuit A4. That is, the first input terminal of the second AND circuit A4 is connected to the pulse counter 32 via the inverter N4.

The signal X from the first AND circuit A3 and the signal Y from the second AND circuit A2 are provided to the up-down counter BC2. In the present embodiment, the oscillation circuit 11 provides the up-down counter BC2 with the pulse signal. When the input signal X has a high level, the up-down counter BC2 increases the count value by one whenever receiving a pulse signal from the oscillation circuit 11 and updates the stored count value. When the input signals X and Y have a low level, the up-down counter BC2 maintains the stored count value. When the input signal Y has a high level, the up-down counter BC2 decreases the count value by one whenever receiving a pulse signal from the oscillation circuit 11 and updates the stored count value. When receiving the load signal LS1 during the load/reset period T2, the up-down counter BC2 provides the oscillation circuit 11 with the data signals D0 to D4 corresponding to the stored count value.

Self-Calibration Process

The self-calibration process of the present embodiment will now be described. In the same manner as the first embodiment, in the present embodiment, the timing control unit repeatedly outputs the count start signal, the load signal LS1, and the reset signal until the calibration period ends.

In the present embodiment, when the charging/holding period T1 starts, the pulse counter 32 provides the charging circuit 13 with the output signal S1 to charge the capacitor C1 and raise the voltage V1 at the connection node ND1 in the same manner as in the first embodiment. In this case, the output signal of the comparator CMP1 initially has a low level.

In the charging/holding period T1, the pulse counter 32 initially provides the calibration circuit 35 with a calibration reference signal S2 having a low level. Thus, a signal having a low level is input to the first input terminal of the first AND circuit A3, and a signal having a high level is input to the first input terminal of the second AND circuit A4.

Example. When Calibration Reference Signal S2 Shifts to High Level Before Output Signal of Comparator CMP1. A case in which the pulse counter 32 reaches the count Nc1 thereby completing counting and provides the calibration circuit 35 with a calibration reference signal S2 having a high level before the voltage V1 of the connection node ND1 exceeds the reference voltage VREF will now be described. In this case, the calibration reference signal S2 shifts from a low level to a high level. The output signal of the comparator CMP1 maintains a low level.

Thus, the signal provided to each input terminal of the first AND circuit A3 thus shifts to a high level, and the signal X of the first AND circuit A3 shifts to a high level. The signal provided to each input terminal of the second AND circuit A4 shifts to a low level, and the signal Y of the second AND circuit A4 shifts to a low level. Accordingly, the up-down counter BC2 receives a signal X having a high level and a signal Y having a low level. When receiving the high level signal X, the up-down counter BC2 increases the stored count value by one whenever the pulse signal is provided from the oscillation circuit 11.

Then, when the voltage V1 at the connection node ND1 becomes higher than or equal to the reference voltage VREF, the output of the comparator CMP1 shifts to a high level. In this case, the signal X of the first AND circuit A3 shifts to a low level. The signal Y of the second AND circuit A4 remains low. Therefore, the up-down counter BC2 maintains the stored count value. Further, when receiving the load signal LS1 during the load/reset period T2, the up-down counter BC2 provides the oscillation circuit 11 with the data signals D0 to D4 corresponding to the stored count value. The oscillation circuit 11 calibrates the frequency f0 of the output signal in accordance with the calibration value of the data signals D0 to D4. In this case, the voltage V1 is lower than the reference voltage VREF even after reaching the count Nc1 and completing counting. Thus, the oscillation circuit 11 calibrates and decreases the frequency f0 of the output signal.

Example when Output Signal of Comparator CMP1 Shifts to High Level Before Calibration Reference Signal S2

A case in which the voltage V1 at the connection node ND1 becomes higher than or equal to the reference voltage VREF before the pulse counter 32 reaches the count Nc1 and completes counting will now be described. In this case, the calibration reference signal S2 remains low. The output signal of the comparator CMP1 shifts from a low level to a high level.

Thus, the signal provided to each input terminal of the first AND circuit A3 shifts to a low level, and the signal X of the first AND circuit A3 shifts to a low level. The signal provided to each input terminal of the second AND circuit A4 shifts to a high level, and the signal Y of the second AND circuit A4 shifts to a high level. Accordingly, the up-down counter BC2 receives a signal X having a low level and a signal Y having a high level. When receiving the high level signal Y, the up-down counter BC2 decreases the stored count value by one whenever the pulse signal is provided from the oscillation circuit 11.

Then, when the pulse counter 32 reaches the count Nc1 and completes counting, the calibration reference signal S2 shifts to a high level. In this case, the signal Y of the second AND circuit A4 shifts to a low level. The signal X of the first AND circuit A3 remains low. Thus, the up-down counter BC2 maintains the stored count value. When receiving the load signal LS1 during the load/reset period T, the up-down counter BC2 provides the oscillation circuit 11 with the data signals D0 to D4 corresponding to the stored count value. The oscillation circuit 11 calibrates the frequency f0 of the output signal in accordance with the calibration value of the data signals D0 to D4. In this case, the voltage V1 becomes higher than or equal to the reference voltage VREF before the count Nc1 is reached and counting is completed. Thus, the oscillation circuit 11 calibrates and increases the frequency f0 of the output signal.

In addition to advantages (4) to (6), the present embodiment has the advantages described below.

(8) In the present embodiment, the pulse counter 32 outputs the output signal S1 when receiving the count start signal. When acquiring the output signal S1, the switch SW1 of the charging circuit 13 connects the constant current source PS1 and the capacitor C1 to charge the capacitor C1 and raise the voltage V1 at the connection node ND1. In this case, the output signal of the comparator CMP1 of the calibration circuit 35 becomes higher than or equal to the reference voltage VREF. The pulse counter 32 counts the pulse signal until reaching the count Nc1, and outputs the calibration reference signal S2 to the calibration circuit 35 when completing counting. When the output signal of the comparator CMP1 shifts before the calibration reference signal S2, the calibration circuit 35 provides the oscillation circuit 11 with a calibration value for increasing the frequency f0. When the calibration reference signal S2 shifts before the output signal of the comparator CMP1, the calibration circuit 35 provides the oscillation circuit 11 with a calibration value for lowering the frequency f0. Thus, the frequency f0 of the oscillation circuit 11 is calibrated in accordance with the timing at which the voltage V1 at the connection node ND1 becomes equal to the reference voltage VREF and the timing at which the pulse counter 32 completes counting. As a result, the oscillator 10 efficiently and automatically calibrates the frequency f0 without using a charge pump.

(9) In the present embodiment, the calibration circuit 35 includes the comparator CMP1, which compares the voltage V1 at the connection node ND1 that rises from when the pulse counter 32 starts counting with the reference voltage VREF, the inverters N3 and N4, the first AND circuit A3, the second AND circuit A4, and the up-down counter BC2. When the calibration reference signal S2 shifts to a high level before the output signal of the comparator CMP1, the signal X provided to the up-down counter BC2 shifts to a high level. In this case, the up-down counter BC2 increases the count value by one whenever receiving a pulse signal from the oscillation circuit 11 and updates the stored count value during a period from when the voltage V1 rises to when the output of the comparator CMP1 shifts to a high level. When the output signal of the comparator CMP1 shifts to a high level before the calibration reference signal S2, the signal Y provided to the up-down counter BC2 shifts to a high level. In this case, the up-down counter BC2 decreases the count value by one whenever receiving a pulse signal from the oscillation circuit 11 and updates the stored count value during a period from when the pulse counter 32 completes counting to when the calibration reference signal S2 shifts to a high level. When receiving the load signal LS1, the up-down counter BC2 provides the oscillation circuit 11 with the data signals D0 to D4 corresponding to the count value. Accordingly, when performing calibration during a single cycle of the count start signal, the load signal LS1, and the reset signal, there is a time difference between the period from when counting starts to when the voltage V1 becomes higher than the reference voltage VREF and the period from when the counting starts to when the calibration reference signal S2 shifts to a high level to indicate the completion of the counting. The number of pulse signals during this time difference is subtracted from or added to the count value. Thus, the oscillation circuit 11 is provided with a further appropriate calibration value for calibrating the frequency f0 during a single cycle. As a result, the frequency f0 is automatically calibrated within a shorter period of time.

It should be apparent to those skilled in the art that the present invention may be embodied in many other specific forms without departing from the spirit or scope of the invention. Particularly, it should be understood that the present invention may be embodied in the following forms.

The calibration circuits 15 and 35 in the first and third embodiments respectively include the up-down counters BC1 and BC2, which increases the count value when decreasing the frequency f0 and decreases the count value when increasing the frequency f0. However, the calibration circuits 15 and 35 are not limited to such an arrangement as long as the frequency f0 of the output signal of the oscillation circuit 11 may be calibrated based on the voltage V1. For example, the up-down counters BC1 and BC2 may decrease the count value when decreasing the frequency f0 and increase the count value when increasing the frequency f0.

In the second embodiment, thirty-one comparators CP(1) to CP(31) and thirty-two resistors Rc(1) to Rc(32) are used. The number of the comparators and resistors may be changed when necessary. In the second embodiment, the resistors Rc(1) to Rc(32) have the same the resistance. However, the resistors Rc(1) to Rc(32) may have different resistances. For example, resistors closer to the high potential power supply voltage VDD and the low potential power supply voltage VSS may have larger resistances to further finely adjust an intermediate value between the high potential power supply voltage VDD and the low potential power supply voltage VSS. In this case, fine calibration of the frequency f0 may be further facilitated by using the intermediate value as a target value for the voltage V1 when the charging period Tc1 ends.

In the third embodiment, the pulse counter 32 provides the calibration circuit 35 with a calibration reference signal S2 having a low level when performing counting and a calibration reference signal S2 having a high level when ending counting. The calibration reference signal S2 is not limited in such a manner as long as it allows the pulse counter 32 to recognize that counting has been completed. In other words, the pulse counter 32 may provide the calibration circuit 35 with a calibration reference signal S2 having a high level when performing counting and a calibration reference signal S2 having a low level when completing counting. In this case, processes similar to the third embodiment may be performed by changing the arrangement of the inverters N3 and N4 in the calibration circuit 35 and the structure of the up-down counter BC2.

In the third embodiment, the calibration circuit 35 includes the up-down counter BC2, which subtracts or adds the count value in accordance with the pulse signal. The calibration circuit 35 is not limited in such a manner as long as it changes the calibration value in accordance with the temporal relationship of when the voltage V1 of the connection node ND1 becomes higher than or equal to the reference voltage VREF and the when counting is completed. For example, in lieu of the up-down counter BC2 of the third embodiment, the up-down counter BC1, which updates its count value by adding one to or subtracting one from the stored count value in accordance with the received load signal LS1, may be used in the same manner as the first embodiment. In this case, the calibration value is gradually adjusted in each cycle. However, the signal of the oscillation circuit 11 does not have to be provided to the up-down counter BC1 and there may be just one reference voltage.

In each embodiment described above, the constant current source PS1 is used to charge the capacitor C1 in the charging circuit 13. However, the capacitor C1 does not have to be charged by the constant current source PS1. For example, instead of using the constant current source PS1, the switch SW1 may be connected to the high potential line via a resistor. This further simplifies the structure of the charging circuit 13.

The present examples and embodiments are to be considered as illustrative and not restrictive, and the invention is not to be limited to the details given herein, but may be modified within the scope and equivalence of the appended claims.

What is claimed is:

1. A self-calibrating oscillator, comprising:
an oscillation circuit that outputs a frequency corresponding to a calibration value;
a pulse counter that counts an output signal from the oscillation circuit a predetermined number of times and outputs a control output signal when the counting is completed;
a charging circuit that supplies and charges a capacitor in response to the control output signal; and
a calibration circuit that compares a voltage at a connection node of the capacitor and a reference voltage and generates the calibration value from the comparison result,
wherein the calibration circuit includes:
a first comparator that compares a charging voltage at the connection node when the charging ends with a high potential reference voltage that defines an upper limit value of the charging voltage;
a second comparator that compares the charging voltage with a low potential reference voltage that defines a lower limit value of the charging voltage; and
a calibration up-down counter that has an initial predetermined count value, which outputs the calibration value in correspondence with a stored count value,
wherein the calibration up-down counter updates the count value by adding to or subtracting from the count value to decrease the frequency when the charging voltage is lower than the low potential reference voltage, and the calibration up-down counter updates the count value by subtracting from or adding to the count value to increase the frequency when the charging voltage is higher than the high potential reference voltage.

2. A self-calibrating oscillator, comprising:
an oscillation circuit that outputs a frequency corresponding to a calibration value;
a pulse counter that counts an output signal from the oscillation circuit a predetermined number of times, outputs a control output signal from when the counting starts, and outputs a completion indication signal indicating completion of the counting;
a charging circuit that supplies and charges a capacitor in response to the control output signal; and
a calibration circuit that receives a reference indication signal, indicating that voltage at a connection node of the capacitor is higher than or equal to a reference voltage, and the completion indication signal, and which generates the calibration value in accordance with a temporal relationship of the voltage at the connection node when the voltage at the connection node is greater than or equal to the reference voltage and when the counting is completed.

3. The self-calibrating oscillator of claim 2, wherein the calibration circuit includes:

a comparator that compares the voltage at the connection node of the capacitor with the reference voltage; and a calibration up-down counter that has an initial predetermined count value, which outputs the calibration value in correspondence with a stored count value;

wherein when receiving a signal from the comparator indicating that the voltage at the connection node is higher than the reference voltage before receiving the completion indication signal from the pulse counter indicating completion of the counting, the calibration up-down counter continuously updates the count value by subtracting from or adding to the count value whenever receiving a pulse signal from the oscillation circuit to increase the frequency until receiving the completion indication signal indicating completion of the counting; and when receiving the completion indication signal from the pulse counter indicating completion of the counting before receiving the signal from the comparator indicating that the voltage at the connection node is higher than the reference voltage, the calibration up-down counter continuously updates the count value by adding to or subtracting from the count value whenever receiving a pulse signal from the oscillation circuit to decrease the frequency until receiving the signal from the comparator indicating that the voltage at the connection node is higher than the reference voltage.

4. The self-calibrating oscillator according to claim 3, wherein the charging circuit includes a constant current source, a switch, and a capacitor, which are connected in series;

the connection is a connection node of the switch and the capacitor; and the switch connects the constant current source and the capacitor to perform charging when provided with the control output signal and disconnects the constant current source and the capacitor when the control output signal is stopped.

5. The self-calibrating oscillator according to claim 4, wherein the connection node is connected to a reset circuit which sets the voltage at the connection node to an initial predetermined value before the pulse counter starts counting.

6. A self-calibrating oscillator, comprising:

an oscillation circuit that outputs a frequency corresponding to a calibration value;

a pulse counter that counts an output signal from the oscillation circuit a predetermined number of times and outputs a control output signal until the counting is completed;

a charging circuit that receives the control output signal and charges a capacitor in response to the control output signal;

a calibration circuit, connected to the capacitor, that compares a voltage at a connection node of the capacitor and a reference voltage and generates the calibration value from the comparison result, wherein the calibration circuit is a flash analog-to-digital converter having a plurality of comparators and an encoder, and generates the calibration value in correspondence with output signals of the comparators, and the voltage at the connection node when the capacitor is charged is supplied to one input terminal of each of the plurality of comparators, and an intermediate value of a low potential reference voltage and a high potential reference voltage is supplied to a further input terminal of each of the plurality of comparators.

* * * * *